US005534445A

United States Patent [19]
Tran et al.

[11] Patent Number: 5,534,445
[45] Date of Patent: Jul. 9, 1996

[54] METHOD OF FABRICATING A POLYSILICON THIN FILM TRANSISTOR

[75] Inventors: Nang T. Tran; Michael P. Keyes, both of St. Paul, Minn.

[73] Assignee: Minnesota Mining and Manufacturing Company, St. Paul, Minn.

[21] Appl. No.: 447,926

[22] Filed: May 23, 1995

Related U.S. Application Data

[63] Continuation of Ser. No. 978,184, Nov. 17, 1992, abandoned, which is a continuation of Ser. No. 648,529, Jan. 30, 1991, abandoned.

[51] Int. Cl.$^6$ .................................................. H01L 21/336
[52] U.S. Cl. ............................ 437/21; 437/41; 437/937; 437/233
[58] Field of Search ................... 437/40 TFT, 41 TFT:21, 437/101, 937, 941, 24, 233; 204/192.23

[56] References Cited

U.S. PATENT DOCUMENTS

| | | | |
|---|---|---|---|
| 4,226,898 | 10/1980 | Ovshinsky et al. | 437/83 |
| 4,751,196 | 6/1988 | Pennell et al. | 437/84 |
| 4,766,477 | 8/1988 | Nakagawa et al. | 357/59 |
| 4,769,338 | 9/1988 | Ovshinsky et al. | 437/101 |
| 4,851,363 | 7/1989 | Troxell et al. | 437/40 |
| 4,857,976 | 8/1989 | Overhauser et al. | 357/23.1 |
| 4,859,617 | 8/1989 | Nomoto et al. | 437/937 |
| 4,866,003 | 9/1989 | Yokoi et al. | 437/241 |
| 4,880,753 | 11/1989 | Meakin et al. | 437/41 |
| 4,883,766 | 11/1989 | Ishida et al. | 437/937 |
| 4,943,837 | 7/1990 | Konishi et al. | 437/937 |
| 5,273,910 | 12/1993 | Tran et al. | 437/3 |

FOREIGN PATENT DOCUMENTS

| | | | |
|---|---|---|---|
| 0152624 | 8/1985 | European Pat. Off. . | |
| 0383230 | 8/1990 | European Pat. Off. . | |
| 0016462 | 1/1985 | Japan | 437/937 |
| 61-46069 | 3/1986 | Japan . | |
| 0051264 | 3/1987 | Japan | 437/937 |
| 0261880 | 10/1988 | Japan | 437/937 |
| 0061062 | 3/1989 | Japan | 437/937 |
| 1275745 | 11/1989 | Japan | 204/192.23 |
| 0082578 | 3/1990 | Japan | 437/937 |

OTHER PUBLICATIONS

Ohshima, Negishi, Hayashi, Noguchi and Mizumuram "Sub–μm Polysilicon Super Thin Film Transistor", IEDM 1986, pp. 196–199.

*Hydrogenation for Polysilicon MOSFET's by Ion Shower Doping Technique* by K. Setsune, M. Miyauchi and T. Hirao dated 1986.

Hu et al, "Deposition of Silicon Nitride by RF Sputtering in Ammonia and Argon Mixture", IBM Technical Disclosure Bulletin, vol. 10, No. 2, Jul. 1967, p. 100.

Matso et al., "Low Temperature Chemical Vapor Deposition Method Utilizing an Electron Cyclotron Resonance Plasma", Jap. J. of Appl. Physics, vol. 22, No. 4, Apr. 1983, pp. L210–L212.

Kamins, "Hydrogenation of Transistors Fabricated in Polycrystalline–Silicon Films", *IEEE Electron Device Letters*, vol. EDL–1, No. 8, pp. 159–161 (Aug. 1980).

Proano et al, "Fabrication and Properties of Single, Double and Triple Gate Polycrystalline–Silicon Thin Film Transistors", *Proc. of Materials Research Society Symposium*, vol. 106, pp. 317–322 (1988).

Unagami et al, "High–Performance Poly–Si TFT's with ECR–Plasma Hydrogen Passivation", *IEEE Transaction on Electron Devices*, vol. 36, No. 3, pp. 529–533 (Mar. 1989).

Pollack et al, "Hydrogen Passivation of Polysilicon MOSFET's From a Plasma Nitride Source", *IEEE Electron Device Letters*, vol. EDL–5, No. 11, pp. 468–470 (Nov. 1984).

Faughman et al, "A Study of Hydrogen Passivation of Grain Boundaries in Polysilicon Thin–Film Transistors", *IEEE Transactions on Electron Devices*, vol. 36, No. 1, pp. 101–107, (Jan. 1989).

Fritzsche, "Heterogeneities and Surface Effects in Glow Discharge Deposited Hydrogenated Amorphous Silicon Films", *Thin Solid Films*, vol. 90, pp. 119–129, (1982).

Biegelsen et al, "Hydrogen Evolution and Defect Creation in Amorphous Si:H Alloys", *Physical Review B*, vol. 20, No. 12, pp. 4839–4846 (Dec. 15, 1979).

Primary Examiner—Mary Wilczewski
Attorney, Agent, or Firm—Gary L. Griswold; Walter N. Kirn; Steven J. Shumaker

[57] ABSTRACT

A process for producing a polysilicon thin film transistor includes hydrogenating the thin film transistor and depositing an atomic hydrogen-containing layer on the thin film transistor. The thin film transistor is characterized by leakage current rates as low as $10^{-13}$A.

5 Claims, 2 Drawing Sheets

METHOD OF FABRICATING A POLYSILICON THIN FILM TRANSISTOR

This is a continuation of application Ser. No. 07/978,184 filed Nov. 17, 1992, now abandoned, which is a continuation of application Ser. No. 07/648,529, filed Jan. 30, 1991, now abandoned.

BACKGROUND OF THE INVENTION

The present invention relates to polysilicon thin film transistors, and in particular, it relates to those thin film transistors that are suitable for use in fabricating radiation sensors and flat panel displays.

Field Effect Thin Film Transistors (TFTs) fabricated from polysilicon are becoming important due to their potential for use in sensors and flat panel displays. Polysilicon is becoming a material of choice since TFTs fabricated from polysilicon offer high mobility and stable operation.

However, grain boundaries in polysilicon TFTs exert considerable influence on TFT characteristics such as degradation of carrier transport. Polysilicon TFTs have an anomalous leakage current which decreases the ON/OFF current ratio of the drain current. One source of leakage current is the leakage current produced by grain-boundary defects. Trap states at the grain boundaries result in a localized potential barrier being formed for passage of carriers from grain to grain. Therefore, reducing the trap state density becomes increasingly important since it has been suggested that decreasing the grain boundary trap state density can reduce the leakage current and enhance mobility.

Hydrogen passivation is one known method for reducing grain boundary trap density and improving the performance of polysilicon TFTs. Kamins et al, "Hydrogenation of Transistors Fabricated in Polycrystalline-Silicon Films" *IEEE Electron Device Letters*, Volume EDL-1, No. 8, pgs. 159–161 (August 1980) discussed the effect of subjecting a completed polysilicon thin film transistor to a hydrogen-nitrogen plasma in a planar plasma reactor. The plasma creates an active species of hydrogen which can then migrate into the polysilicon film, passivating the grain boundary states. After hydrogenation, field effect mobility increased by more than a factor of 10 from 2.6 to 34 $cm^2$/V-sec. Proano et al, "Fabrication and Properties of Single, Double, and Triple Gate Polycrystalline-Silicon Thin Film Transistors", *Proc. of Materials Research Society Symposium*, Vol. 106, pgs. 317–322 (1988), discussed the effect of plasma hydrogenation of polysilicon TFTs. The hydrogenation was performed in a hydrogen-nitrogen atmosphere at 300° C. for up to 30 minutes. It was found that drain-source OFF current was reduced from $5 \times 10^{-10}$A to $1 \times 10^{-12}$A.

Takashi et al, "High-Performance Poly-Si TFT's With ECR-Plasma Hydrogen Passivation", *IEEE Transactions on Electron Devices*, Vol. 36, No. 3, pgs. 529–553 (March 1989), describe hydrogenation carried out in an electron cyclotron resonance reactor on polysilicon TFTs. A small grain polysilicon film (average grain size approximately 40 nm) was deposited on a quartz substrate at a thickness of 0.3 µm by low pressure chemical vapor deposition at 625° C. Recrystallization using CW-Ar laser annealing was performed on the polysilicon film to obtain large grains. A standard MOS transistor fabrication process was used to form the polysilicon TFTs. Gate oxide film was obtained by thermal-oxidation of polysilicon at 1,000° C. in dry oxygen with a thickness of the oxide film at 0.1 µm. At the gate electrode, a 0.3 µm thick polysilicon layer was deposited by low pressure chemical vapor deposition and patterned. After deposition of the polysilicon layer, the source and drain regions were opened. A phosphosilicate glass (PSG) was deposited and annealed at 900° C. for one hour in nitrogen to form $n^+$regions. The PSG film was removed and aluminum film deposited and patterned. The TFTs were then annealed in a hydrogen atmosphere at 400° C. The TFTs were treated in a hydrogen plasma with ECR-plasma apparatus at 300° C. A magnetron was used to generate microwaves at a frequency of 2.5 GHz through a rectangular wave guide into the plasma chamber. Argon was introduced into the plasma chamber at 15 sccm and hydrogen was introduced into the specimen chamber also at 15 sccm. Treatment was performed at 600 W for 30 minutes. After annealing, the carrier mobility was found to have increased from 33.7 $cm^2$/V. sec. to 151.0 $cm^2$/V. sec. It was also observed that the leakage current of the ECR hydrogen plasma treated TFTs was lower than that in the TFT without hydrogen passivation.

Pollack et al, "Hydrogen Passivation of Polysilicon MOSFET's From a Plasma Nitride Source", *IEEE Electron Device Letters*, Vol. EDL-5, No. 11, pgs. 468–470 (November 1984) studied the effects of hydrogen passivation of polysilicon TFTs using a plasma silicon nitride source. The hydrogen passivation was performed as an extra step with the hydrogen from silicon nitride source being driven into the polysilicon by annealing in nitrogen at 450° C. A silicon nitride layer was plasma-deposited on the polysilicon TFT. The silicon nitride layer has sufficient hydrogen, typically greater than $10^{22} cm^{-3}$, such that the layer constitutes an ideal diffusion source for atomic hydrogen. Annealing was performed at 450° C. to hydrogen passivate the polysilicon grain boundaries.

Faughnan et al, "A Study of Hydrogen Passivation of Grain Boundaries and Polysilicon Thin-Film Transistors", *IEEE Transactions on Electron Devices*, Vol. 36, No. 1, pgs. 101–107 (January 1989) discussed the effect of hydrogen passivation of grain boundaries on the leakage current of polycrystalline silicon thin-film transistors. Hydrogen passivation was carried out either by annealing the TFTs in a forming gas (5% hydrogen+95% ammonia) at 600° C., 700° C., and 800° C., or by annealing in ammonia gas at 800° C. followed by depositing a 60 nm layer of silicon nitride. Some wafers received further annealing in the forming gas at 500° C. No further heat treatment was performed after the passivation step. Leakage current was found to be reduced but it was thought that the silicon nitride layer was too thin to play a role. It should be noted that the silicon nitride that was deposited in the study by Faughnan et al was deposited at 800° C. At such a high temperature, hydrogen tends to be driven out of the deposited layer making the silicon nitride layer not a good hydrogen source.

The Meakin et al U.S. Pat. No. 4,880,753 describes a process for manufacturing a polysilicon TFT. The Troxell et al U.S. Pat. No. 4,851,363, the Nakagawa et al U.S. Pat. No. 4,766,477, the Pennell et al U.S. Pat. No. 4,751,196, and the Japanese published application 61-046069 describe the use of silicon nitride layers as insulating layers or surface protective layers against oxidation or moisture in TFTs.

In each of the above-mentioned examples optimizing the conditions to produce consistently high quality polysilicon TFTs has been difficult. For example, in hydrogen passivation of grain boundaries using an atomic hydrogen-containing layer such as silicon nitride films, the properties of the film are critical for obtaining effective and consistent hydrogen passivation of the grain boundaries. Furthermore, diffusion of the hydrogen from the silicon nitride layer occurs at deposition temperatures above 500° C. See for instance Fritzsche, "Heterogeneities and Surface Effects in Glow Discharge Deposited Hydrogenated Amorphous Silicon Films", *Thin Solid Films,* Vol. 90, pgs. 119–129 (1982); Biegelsen et al, "Hydrogen Evolution and Defect Creation in Amorphous Si:H Alloys", *Physical Review B,* Vol. 20, No. 12, pgs. 4839–4846 (Dec. 15, 1979).

SUMMARY OF THE INVENTION

The present invention includes a process for making a thin film transistor by both hydrogen passivating the thin film transistor and depositing a layer of an atomic hydrogen-containing substance. The hydrogen passivation may either proceed or follow the deposition of the atomic hydrogen-containing substance on the TFT. The process of the present invention provides for a more consistent hydrogen passivation of the grain boundaries of the polysilicon of the TFT.

DETAILED DESCRIPTION OF THE PREFERRED EMBODIMENTS

The process of the present invention produces a polysilicon thin film transistor (TFT) with very low leakage currents and high sensitivity that is suitable for use in solid state radiation sensors, and particularly sensors designed for imaging and medical radiography. The method of the present invention provides for hydrogen passivation of polysilicon grain boundaries in a reproducible manner that is much easier to control and is much more production oriented than the methods of the prior art.

By using both plasma hydrogenation and plasma deposition of a layer of an atomic hydrogen containing substance, more consistent hydrogen passivation of the polysilicon is achieved, along with a leakage current as low as $10^{-13}$A. The hydrogenation may either proceed or follow the deposition of the layer of the atomic hydrogen-containing substance. The hydrogen-containing substance includes substances such as silicon nitride, silicon oxide, silicon oxide nitride, and silicon carbide, which are deposited in the final stages of fabricating the TFT. Other substances than those listed are also includable within the present invention as long as the substance is a good hydrogen source that is the substance contains $10^{19}$ to $10^{22}$ atoms/cm$^3$. It is believed that a good hydrogen source further reduces the trap state density of the grain boundaries of the polysilicon and therefore reduces the leakage current of the polysilicon TFT.

A preferred substance is hydrogenated silicon nitride. The hydrogenation can be carried out by either hydrogen ion implantation followed by plasma deposition. Such a procedure has the advantage that a final annealing step is not needed.

Figure 1:
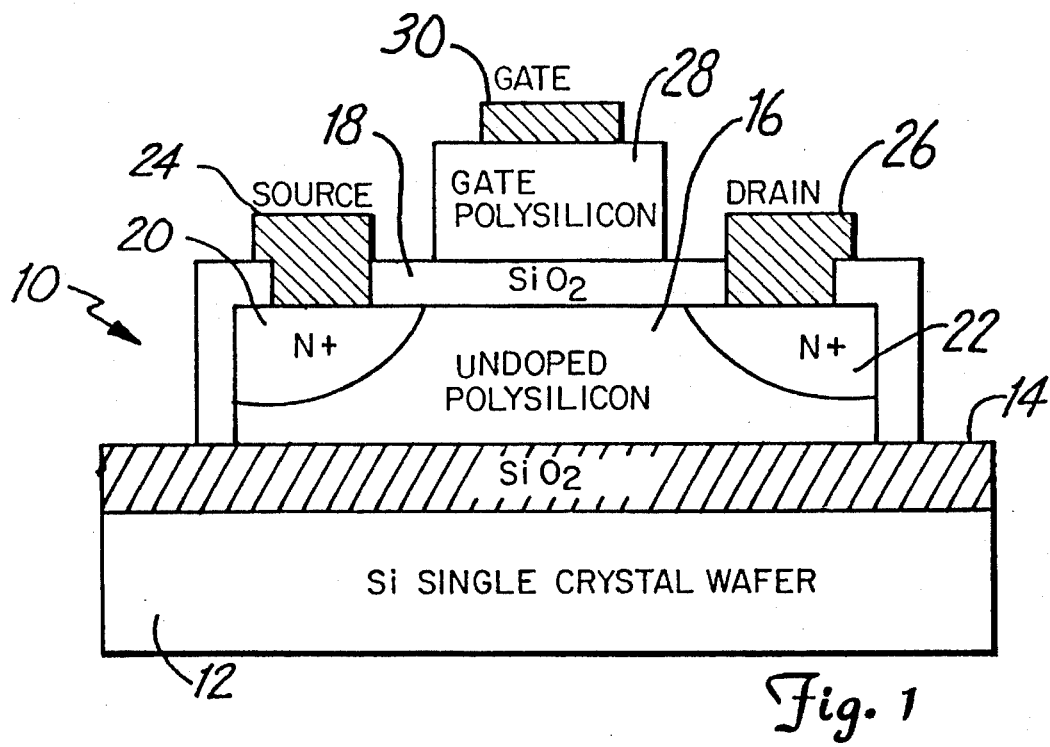
FIG. 1 is a schematic diagram of a thin film transistor used in the present invention.

A schematic diagram of the structure of a polysilicon TFT of the present invention is generally indicated at 10 in FIG. 1. A substrate such as a single crystal silicon wafer is coated with a thin insulating layer 14 of silicon dioxide at approximately 1 μm using thermal oxidation techniques.

An undoped amorphous silicon film 16 of approximately 1,500 Å is deposited at 550° C. on the silicon dioxide layer 14 by low pressure chemical vapor deposition (LPCVD). The silicon coated wafer is then annealed typically at 620° C. in nitrogen for approximately 24 to 36 hours to form a polysilicon film with a grain size in the range of 600 Å to 5,000 Å. Amorphous silicon film can also be made at 200° C. to 300° C. using plasma-enhanced chemical vapor deposition (PECVD). The film is then annealed in a furnace at 620° C. for 24 to 36 hours or by rapid thermal annealing for 5 to 20 minutes to form polysilicon film. As an option, E-beam annealing can also be used to form polysilicon film.

The polysilicon film 14 is then patterned into islands. A silicon dioxide layer used as the gate dielectric is thermally grown on the polysilicon thin layer 16 to a thickness of approximately 1,000 Å.

A polysilicon layer 28 of approximately 3,500 Å thick is then deposited on the layer 16 by LPCVD. The layer 28 is then patterned and a source area 20, drain area 22, and polysilicon gate are doped with phosphorous to a level of approximately $10^{15}$/cm$^2$ to obtain n-type characteristics, using ion implantation technique.

Contact holes are etched through the oxide over the source and drain areas 20 and 22. As an option, contact holes through the oxide can also be etched before ion implantation. Aluminum is deposited to provide a source contact 24, a drain contact 26, and gate contact 30 for the respective source and drain and gate areas using a lift-off procedure. The aluminum is later used as a blocking mask for reactive ion etching of a subsequently applied silicon nitride layer.

The now formed TFT is annealed at approximately 400° C. in a forming gas of hydrogen and nitrogen at a ratio of 15:85. The annealing step is common practice in the art to improve the aluminum contact of the drain, source, and gate electrodes.

Hydrogen plasma hydrogenation is then performed at a temperature in the approximate range of 150° C. to 400° C., preferably at a temperature of approximately 300° C., for a time in the range of 30 minutes to 4 hours. A radio frequency power density in the range of 0.5 W/cm$^2$ to 20 W/cm$^2$ is used. The reactant gas may be hydrogen or a mixture of hydrogen with nitrogen or with inert gases such as argon and helium. Alternatively, the plasma hydrogenation may be carried out in an electron cyclotron resonance chemical vapor deposition system (ECRCVD).

The deposition of the atomic hydrogen-containing layer may be performed by plasma enhanced chemical vapor deposition of for example, silicon nitride. The plasma power is derived either from a radio frequency supply or from electron cyclotron resonance. A suitable atomic hydrogen-containing layer is of a thickness in the range of 1,000 Å to 5,000 Å deposited from a silane/ammonia/nitrogen gas mixture at a pressure of approximately 1 Torr and a temperature in the range of approximately 150° C. to 450° C., preferably in the range of 200° C. to 400° C.

The hydrogenated silicon nitride layer acts as high concentration diffusion source of atomic hydrogen. Other substances suitable for the atomic hydrogen-containing layer include silicon oxide, silicon carbide, combinations of silicon nitride and silicon oxide, silicon oxide nitride, and other silicon based layers.

The plasma hydrogenation and the succeeding deposition of the atomic hydrogen-containing layer may be carried out in one vacuum pumpdown or may be separated into two vacuum pumpdowns with any interim time period at atmospheric pressure in between the pumpdowns. As can easily be understood, such a procedure provides great latitude in production techniques of the TFT of the present invention.

Polysilicon used in the present invention can be made at a temperature in the range of 550° C. to 620° C. Silicon fabricated at or below 550° C. is amorphous, but can be transformed into polysilicon by annealing at 620° C. for a period of time in the range of 24 to 36 hours, or by rapid thermal annealing, E-beam annealing or by laser annealing. As discussed previously above, the substrate used was a silicon wafer. However, a quartz substrate can also be used and when the process temperature is reduced below 800° C., a glass substrate is also a good candidate.

The improved polysilicon TFTs of the present invention that have been hydrogen passivated, have a leakage current of approximately $10^{-13}$ A. Sensitivity was measured in the range of 5–40 µA/volt, and a preferred range of 30–38 µA/volt shows improvement by a factor in the range of 5 to 8 over the sensitivity of plasma hydrogenated polysilicon TFTs before $SiN_x$ coating. The ON (maximum)/OFF (minimum) current ratio was found to be $10^9$.

The following examples are for illustrative purposes and are not to be considered as limiting the present invention.

EXAMPLE 1

A one micron layer of silicon oxide was grown for insulation on three-inch silicon wafers. Next, undoped polysilicon film of approximately 1,500 Å thick was deposited at 560° C. with $SiH_4$ at 160 mTorr and 28 sccm, using low pressure chemical vapor deposition (LPCVD). The wafers were then annealed in a nitrogen atmosphere of approximately 1.5 Torr at 620° C. for 24 hours. The resulting grain size of the polysilicon film was approximately 500 Å to 700 Å. The polysilicon film was then patterned into islands using microlithographic methods, and approximately 1,000 Å gate oxide was thermally grown on the polysilicon film at approximately 1,150° C. in an oxygen atmosphere. A polysilicon layer of approximately 3,500 Å thick was then deposited using LPCVD for the gate and patterned with deposition conditions of 28 sccm, 180 mTorr at 620° C. $10^{15}/cm^2$ phosphorous was implanted to dope the source, drain, and gate areas. The dopant was activated during a 30 minute nitrogen annealing step at approximately 1,050° C.

Contact holes were then etched through the gate oxide over the source and drain and aluminum deposited for contacts using a lift-off procedure. Aluminum was also deposited as a contact for the gate electrode which is also subsequently used as a blocking mask for the reactive ion etching of the subsequently formed silicon nitride layer.

The now formed TFT was then annealed in a forming gas of approximately 15% hydrogen and 85% nitrogen at 400° C. for 30 minutes. After annealing, the TFT was hydrogenated in a hydrogen plasma of approximately 50% hydrogen at 50% nitrogen under a total pressure of 550 mTorr for 30 minutes at 300° C. using a power density of 1.15 W/cm². The hydrogenated devices were then coated with 3,000 Å of silicon nitride using plasma enhanced chemical vapor deposition and then patterned using reactive ion etching. In the deposition, the $SiH_4/N_2$ ratio was 1/7, and the $NH_3/N_2$ ratio was 1/4. The total pressure used was 1 Torr, and the power density was 0.35 W/cm² at a temperature of 300° C.

Figure 2:
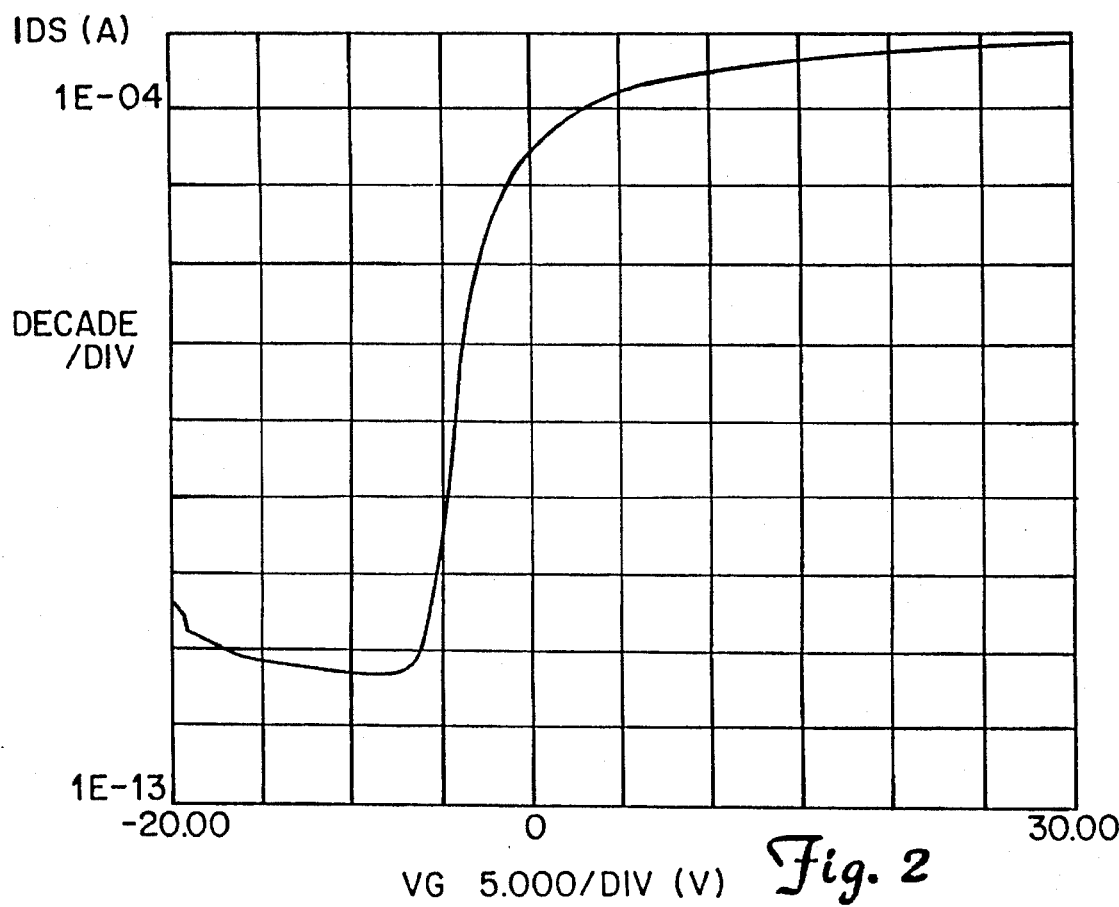
FIG. 2 is a graphical view illustrating the transfer characteristics of a polysilicon TFT after plasma hydrogenation.
Figure 3:
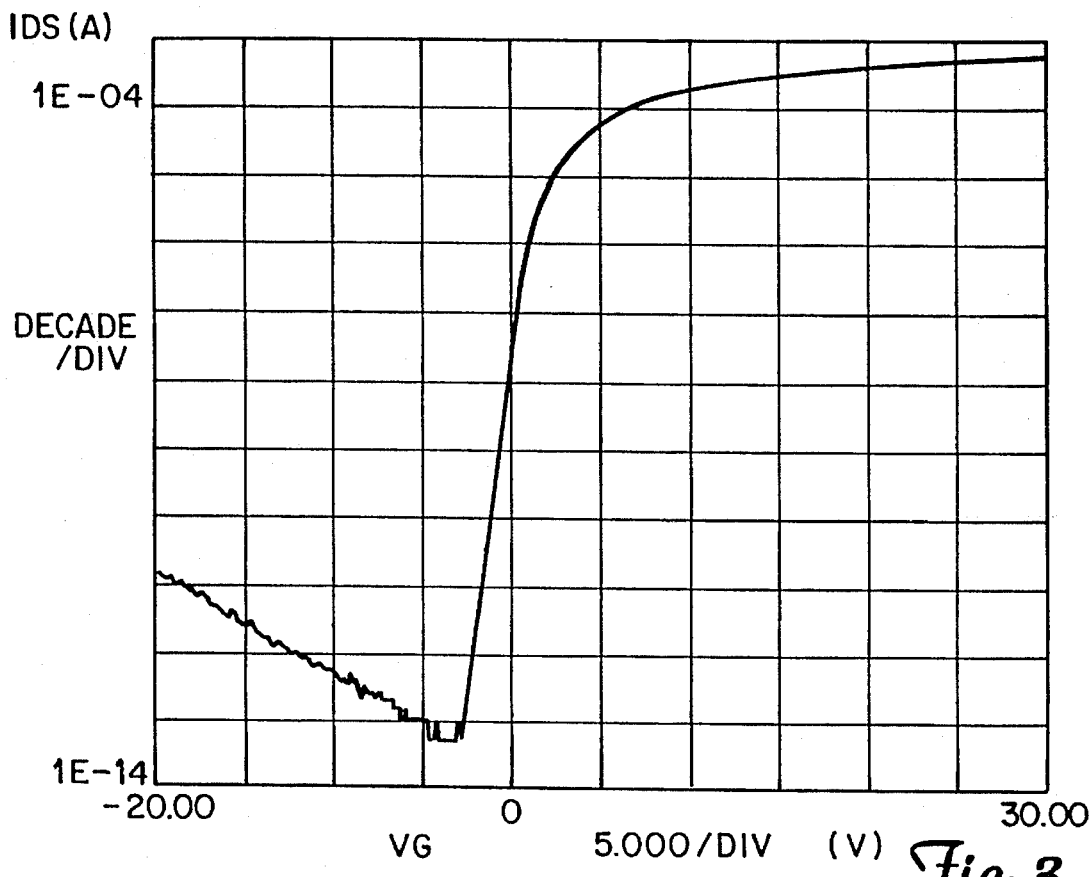
FIG. 3 is a graphical view illustrating the transfer characteristics of a TFT of the present invention after plasma hydrogenation and plasma deposited silicon nitride.
Figure 4:
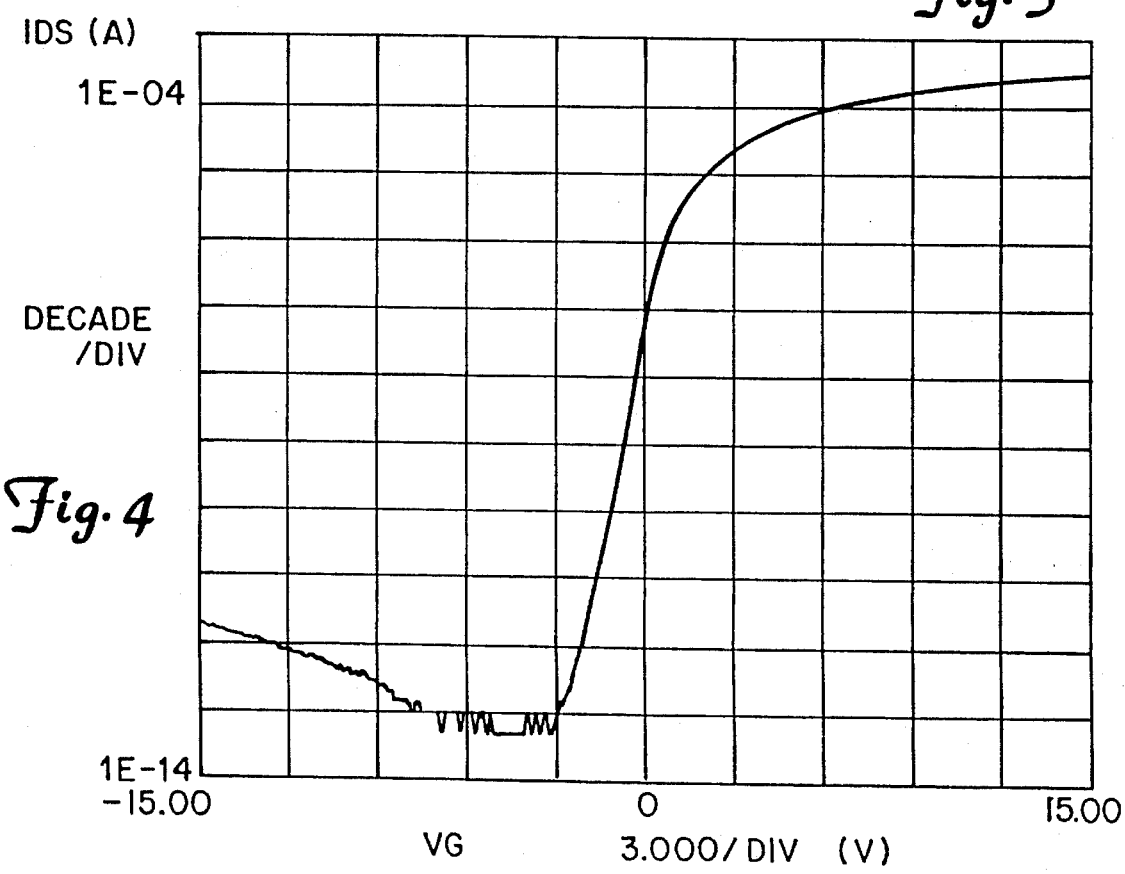
FIG. 4 is a graphical view illustrating the transfer characteristics of polysilicon TFT after plasma hydrogenation and deposition of a silicon nitride layer of the present invention with the TFT being incorporated with an amorphous silicon diode array forming a completed integrated detector.

FIG. 2 illustrates transfer characteristics of polysilicon TFT after plasma hydrogenation while FIG. 3 illustrates transfer characteristics of polysilicon TFT after plasma hydrogenation and plasma deposited $SiN_x$. As can be seen by comparing FIGS. 2 and 3, it was discovered that the leakage current was improved by a factor of 10 when adding the silicon nitride layer from $8\times10^{-12}$ A down to $1\times10^{-13}$ A. Also the sensitivity of the polysilicon TFTs was increased from 5–8 µA/volt to 30–35 µA/volt.

EXAMPLE 2

Polysilicon TFTs produced by the technique described in Example 1 were bonded to a-Si:H photodiodes in a 1×32 array configuration to produce a hybrid structure. Approximately 3,000 Å of silicon nitride was coated using plasma enhanced chemical vapor deposition under the same conditions as described in Example 1. The silicon nitride coating was then followed by approximately 3,000 Å of E-beam deposition of aluminum for formation of a contact pad for contacting the a-Si:H photodiodes. The addition of the silicon nitride layer improved the leakage current from $5\times10^{-12}$A to $2\times10^{-13}$A. In addition, the sensitivity of the polysilicon TFT was increased from 8 µA with plasma hydrogenation to 37 µA with plasma hydrogenation and silicon nitride layer.

EXAMPLE 3

Using the technique described in Example 1 to produce polysilicon TFTs in a photodiode/TFTs solid state radiation detector, measurements were taken after the step of depositing the amorphous silicon photodiode array to complete the radiation detector. In this detector, amorphous silicon photodiode array was stacked on top of the polysilicon TFTs. A leakage current of 8 µA/volt in TFTs was found. This improved leakage current indicates that fabrication steps in producing the amorphous silicon photodiodes did not degrade the performance of TFTs. It is believed that such an improved result is due to the deposition temperatures used to produce all the layers of the amorphous silicon photodiodes, the temperatures being below 300° C., which is low enough not to drive out hydrogen.

Although the present invention has been described with reference to preferred embodiments, workers skilled in the art will recognize that changes may be made in form and detail without departing from the spirit and scope of the invention.

What is claimed is:

1. A process for making a hydrogenated polysilicon thin film transistor comprising the steps of:

providing a substrate;

depositing a layer of amorphous silicon on the substrate;

annealing said layer of amorphous silicon to form a first polysilicon layer;

patterning the first polysilicon layer to form islands;

growing a layer of silicon dioxide on the islands to form a gate dielectric layer;

depositing and patterning a second layer of polysilicon;

doping the first and second polysilicon layers to form a source, a drain, and a gate;

depositing and patterning a metal layer to provide a source contact, a drain contact, and a gate contact for the respective source, drain, and gate and thereby forming a polysilicon thin film transistor;

annealing said polysilicon thin film transistor;

hydrogenating the polysilicon thin film transistor; and depositing an atomic hydrogen-containing layer on the polysilicon thin film transistor.

2. The process of claim 1 wherein said atomic hydrogen-containing layer includes a hydrogenated form of a silicon compound.

3. The process of claim 1 wherein said atomic hydrogen-containing layer contains $10^{19}$ to $10^{22}$ atoms/cm$^3$ of hydrogen.

4. The process according to claim 1, wherein the hydrogenating step occurs after depositing the atomic hydrogen-containing layer.

5. The process according to claim 1, wherein the hydrogenating step occurs before depositing the atomic hydrogen-containing layer.

* * * * *